(12) United States Patent
Baek et al.

(10) Patent No.: US 10,593,745 B2
(45) Date of Patent: Mar. 17, 2020

(54) DISPLAY DEVICE WITH SIGNAL LINE

(71) Applicant: SAMSUNG DISPLAY CO., LTD., Yongin-si, Gyeonggi-Do (KR)

(72) Inventors: Kyung Hyun Baek, Suwon-si (KR); Sang Jo Lee, Hwaseong-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 15/423,199

(22) Filed: Feb. 2, 2017

(65) Prior Publication Data
US 2017/0229527 A1 Aug. 10, 2017

(30) Foreign Application Priority Data

Feb. 4, 2016 (KR) .................. 10-2016-0014468

(51) Int. Cl.
H01L 29/08 (2006.01)
H01L 33/00 (2010.01)
H01L 31/0232 (2014.01)
H01L 21/00 (2006.01)
H01L 27/32 (2006.01)
H01L 27/12 (2006.01)
H01L 23/498 (2006.01)
H01L 23/00 (2006.01)
H01L 51/00 (2006.01)

(52) U.S. Cl.
CPC .... *H01L 27/3276* (2013.01); *H01L 23/49838* (2013.01); *H01L 24/83* (2013.01); *H01L 27/124* (2013.01); *H01L 27/3244* (2013.01); *H01L 27/3246* (2013.01); *H01L 51/0097* (2013.01); *H01L 27/3258* (2013.01); *H01L 2251/5338* (2013.01); *Y02E 10/549* (2013.01)

(58) Field of Classification Search
CPC ............. H01L 27/3244; H01L 51/0097; H01L 27/3276; H01L 27/124; H01L 27/3246; H01L 23/49838; H01L 24/83
See application file for complete search history.

(56) References Cited

U.S. PATENT DOCUMENTS 8,253,672 B2 * 8/2012 Lee ...................... H05K 1/0228
257/678
8,436,348 B2 * 5/2013 Ono .................... H01L 27/3246
257/40
8,907,327 B2 * 12/2014 Kim .................... H05K 1/0298
257/40

(Continued)

FOREIGN PATENT DOCUMENTS

KR 1020110032468 3/2011
KR 1020110049094 5/2011
KR 1020150043890 4/2015

*Primary Examiner* — Alonzo Chambliss
(74) *Attorney, Agent, or Firm* — F. Chau & Associates, LLC

(57) ABSTRACT

A display device including: a substrate including a first region and a second region; a signal line on the substrate and including a first layer and a second layer that overlap each other; and a first insulating layer between the substrate and the signal line, wherein a first organic layer may be between the first layer and the second layer in the first region, and the first layer and the second layer may be in direct contact with each other in the second region, and the first insulating layer may be disposed in an area in which the first organic layer is.

18 Claims, 13 Drawing Sheets

(56) References Cited

U.S. PATENT DOCUMENTS

| | | | |
|---|---|---|---|
| 2006/0097369 A1 | 5/2006 | Hashimoto | |
| 2012/0049175 A1* | 3/2012 | Ono | H01L 27/3246 257/40 |
| 2014/0217373 A1* | 8/2014 | Youn | H01L 23/4985 257/40 |
| 2014/0291641 A1* | 10/2014 | Negishi | H01L 51/5253 257/40 |
| 2015/0380679 A1* | 12/2015 | Fujiyoshi | H01L 51/5253 257/99 |
| 2016/0085125 A1* | 3/2016 | Park | G02F 1/136286 349/43 |
| 2016/0087022 A1* | 3/2016 | Tsai | H01L 27/3276 257/40 |
| 2018/0026231 A1* | 1/2018 | Fujiyoshi | H01L 51/5253 257/99 |

* cited by examiner

DISPLAY DEVICE WITH SIGNAL LINE

CROSS-REFERENCE TO RELATED APPLICATION

This application claims priority under 35 U.S.C. § 119 to Korean Patent Application No. 10-2016-0014468 filed in the Korean Intellectual Property Office on Feb. 4, 2016, the disclosure of which is incorporated by reference herein in its entirety.

TECHNICAL FIELD

The present invention relates to a display device.

DESCRIPTION OF THE RELATED ART

Display devices include a liquid crystal display (LCD), a plasma display panel (PDP), an organic light emitting diode (OLED) display, and the like.

The LCD includes two display panels in which field generating electrodes, such as pixel electrodes and common electrodes, are included, and a liquid crystal layer interposed between the display panels. An electric field is generated in the liquid crystal layer by voltages applied to the field generating electrodes. By adjusting an intensity of the electric field, a transmittance of light passing through the liquid crystal layer is controlled so that an image may be displayed.

The OLED display, which is a self-emissive type of display device, includes two electrodes facing each other and an organic layer interposed between the electrodes. In the OLED display, holes injected from an anode and electrons injected from a cathode are combined in an emission layer to generate excitons. The generated excitons release energy to emit light.

The OLED display, the LCD, etc. may be configured as a foldable display device by using a bendable substrate.

SUMMARY

An exemplary embodiment of the present invention provides a display device including: a substrate including a first region and a second region; a signal line on the substrate and including a first layer and a second layer that overlap each; and a first insulating layer between the substrate and the signal line, wherein a first organic layer may be between the first layer and the second layer in the first region, and the first layer and the second layer may be in direct contact with each other in the second region, and the first insulating layer may be in an area in which the first organic layer is.

The first insulating layer may be a first inorganic layer including an inorganic material, and the first layer may include a bent portion in the first groove.

The first region may be bendable.

The signal line may include a third layer, and a second organic layer may be between the second layer and the third layer.

The signal line may include a fourth layer, and a third organic layer may be between the third layer and the fourth layer.

The display device may further include a second inorganic layer overlapping the first inorganic layer with the signal line therebetween, wherein the second inorganic layer includes a second groove in an area in which the second organic layer is.

The display device may further include a second inorganic layer overlapping the first inorganic layer with the signal line therebetween, wherein the second inorganic layer may include a second groove in the area in which the first organic layer is, and the first organic layer may be in the second groove.

The display device may further include a second inorganic layer overlapping the first inorganic layer with the signal line therebetween, wherein the second inorganic layer may include a second groove in the area in which the first organic layer is, and the second organic layer may be in the second groove.

A plurality of the first regions may be provided.

The signal line may include only one of the first layer and the second layer in a portion of the second region.

The first insulating layer may be a fourth organic layer including an organic material.

The first layer and the second layer may overlap each other in a direction substantially perpendicular to the substrate.

An exemplary embodiment of the present invention provides a display device including: a substrate including a first region and a second region; a signal line on the substrate and including a first layer and a second layer that overlap each other; and a first inorganic layer overlapping the substrate with the signal line therebetween, wherein a first organic layer may be between the first layer and the second layer in the first region, and the first layer and the second layer may be in direct contact with each other in the second region, and the first inorganic layer may include a first groove in an area in which the first organic layer is.

The second layer may include a bent portion positioned in the first groove.

The first region may be bendable.

The signal line may include a third layer, and a second organic layer may be between the second layer and the third layer.

The signal line may include a fourth layer, and a third organic layer may be between the third layer and the fourth layer.

The first layer and the second layer may overlap each other in a direction substantially perpendicular to the substrate.

An exemplary embodiment of the present invention provides a display device including: a substrate; a first insulating later on the substrate, wherein the first insulating layer includes a groove with two step-like sidewalls facing each other; a signal line including a first layer and a second layer on the substrate; and an organic layer between the first and a second layers in the groove.

The first and second layers may directly contact each other away from the groove.

DETAILED DESCRIPTION OF THE EMBODIMENTS

Figure 1:
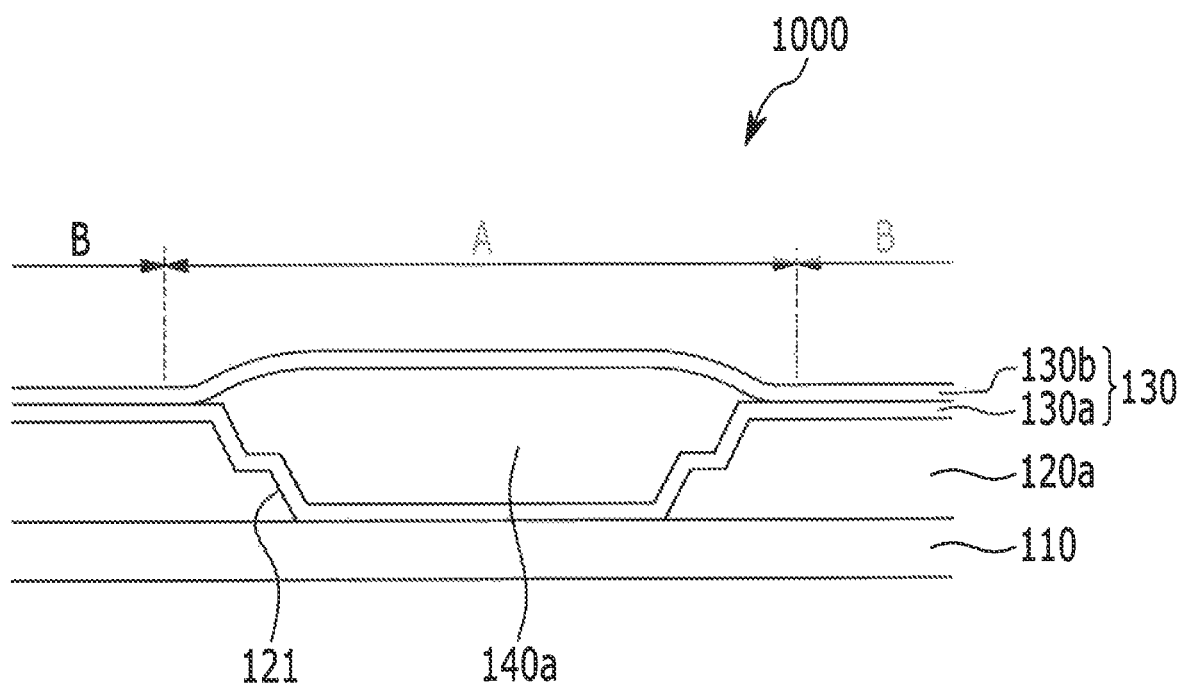
FIG. 1 illustrates a cross-sectional view of a display device according to an exemplary embodiment of the present invention.

Exemplary embodiments of the present invention will be described more fully hereinafter with reference to the accompanying drawings. As those skilled in the art would realize, the described embodiments may be modified in various different ways, and thus, should not be limited to the embodiments set forth herein.

Like reference numerals may designate like elements throughout the specification.

In the drawings, the thickness of layers, films, panels, regions, etc., may be exaggerated for clarity.

Further, throughout the specification, it will be understood that when an element such as a layer, film, region, or substrate is referred to as being "on" another element, it can be directly on the other element or intervening elements may also be present. Further, throughout the specification, the phrase "in a plan view" may mean viewing a target portion from the top, and the phrase "in a cross-sectional view" may mean viewing a cross-section formed by vertically cutting a target portion from the side.

Hereinafter, a display device according to an exemplary embodiment of the present invention will be described in detail with reference to FIG. 1 to FIG. 3.

Figure 2:
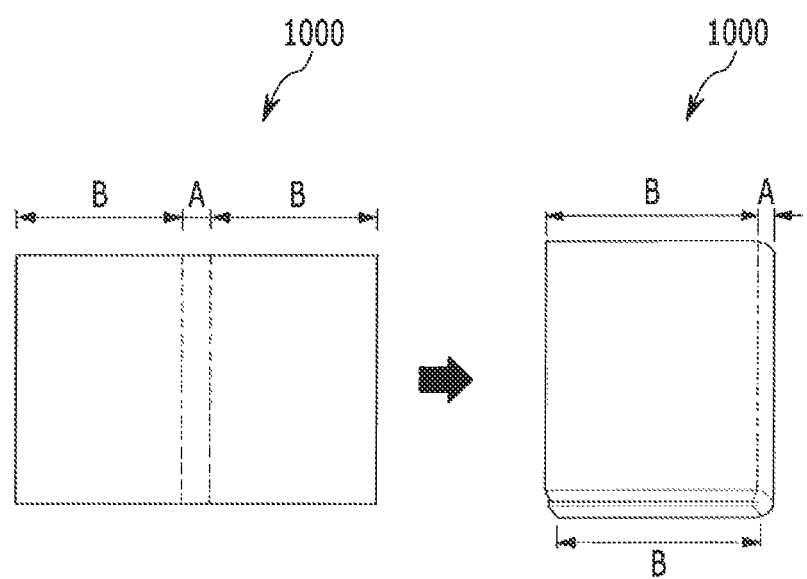
FIG. 2 and FIG. 3 schematically illustrate a state in which a display device according to an exemplary embodiment of the present invention is bent, respectively.
Figure 3:
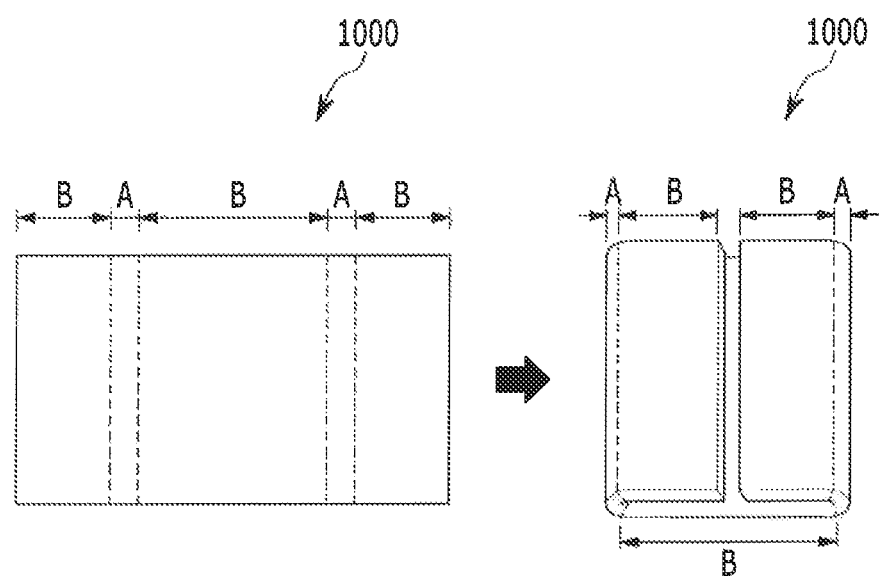

FIG. 1 illustrates a cross-sectional view of a display device according to an exemplary embodiment of the present invention, and FIG. 2 and FIG. 3 schematically illustrate a state in which a display device according to an exemplary embodiment of the present invention is bent, respectively.

A display device 1000 includes a substrate 110 including a first region (A) and a second region (B). The first region (A) of the substrate 110 may be bent, and the second region (B) of the substrate 110 may be a region other than the first region (A). The second region (B) of the substrate 110 is not bent, but the present invention is not limited thereto. For example, the second region (B) may be bent. When the second region (B) of the substrate 110 is bendable, the second region (B) may be bent to have a relatively greater curvature radius compared to the first region (A).

The substrate 110 may be made of a flexible and insulating material. The substrate 110 may include a thin glass, polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), and cellulose acetate propionate (CAP). However, materials included in the substrate 110 are not limited thereto. For example, the substrate 110 may include other materials that are flexible.

A first insulating layer is positioned on the substrate 110. For example, the first insulating layer may be a first inorganic layer 120a. The first inorganic layer 120a may include an inorganic material such as a silicon nitride (SiNx), a silicon oxide (SiOx), etc. In FIG. 1, although it is illustrated that the first inorganic layer 120a is formed as a single layer, the inorganic layer 120a may include more than one layer, and when it is made of more that one layer, the layers thereof may be made of the same material or different materials.

A signal line 130 is positioned on the first inorganic layer 120a. The signal line 130 includes a first layer 130a and a second layer 130b stacked in a direction perpendicular (or substantially perpendicular) to the substrate 110. In the first region (A), a first organic layer 140a is positioned between the first layer 130a and the second layer 130b. However, in the second region (B), the first layer 130a and the second layer 130b are in direct contact with each other. For example, the first layer 130a and the second layer 130b directly contact each other and extend in the second region (B), whereas a gap between the first layer 130a and the second layer 130b expands in the first region (A). The first organic layer 140a is positioned in the expanded gap.

Accordingly, in the first region (A), the first layer 130a and the second layer 130b are respectively positioned at different heights with respect to the direction perpendicular to the substrate 110.

The first organic layer 140a may include an organic material such as a polyacrylate resin, a polyimide resin, etc.

The first inorganic layer 120a includes a first groove 121 formed in a region in which the first organic layer 140a is positioned. The first inorganic layer 120a may be mostly removed from the first region (A). But, for example, some of the first inorganic layer 120a may remain such that the first groove 121 may be formed.

The first layer 130a of the signal line 130 is positioned in (or on) the first groove 121 in the first region (A). In this case, the first layer 130a has a bent portion corresponding to a surface of the first groove 121. In addition, the first organic layer 140a is positioned on the first groove 121.

The first region (A) and the second region (B) may also be in the substrate 110.

The first region (A) is a region that may be bendable, and the second region (B) of the display device 1000 is a region other than the first region (A). The first region (A) may be positioned in one direction in the substrate 110. Herein, the one direction may be any direction on a plane surface of substrate 110; however, the direction in which the first region (A) is arranged is not limited to a particular direction. For example, the substrate 110 may have a rectangular shape in a planar view, and in this case, the one direction in which the rectangular substrate 110 is bent corresponds to a direction parallel to a long or short side of the substrate 110. For example, the substrate 110 may be bent in a short or long side direction in a planar view. The second region (B) is not bent, but the present invention is not limited thereto. For example, the second region (B) may be a bendable region. When the second region (B) is bendable, the second region (B) may be bent to have a relatively greater curvature radius compared to the first region (A).

Referring to FIG. 2, in opposite sides of the display device 1000, the display device 1000 may be bent along the first region (A). The first region (A) along which the display device 1000 is bent may have a straight line shape parallel to the short side direction of the display device 1000, for example.

Referring to FIG. 3, the display device 1000 may include a plurality of first regions (A), and may be bent at each of the plurality of first regions (A). As shown in FIG. 3, the display device 1000 is bent twice along two first regions (A), wherein each of the bent two first regions (A) has the straight line shape parallel to the short side direction of the display device 1000.

A shape in which the display device 1000 is bent is not limited to those shown in FIG. 2 and FIG. 3. For example, the display device 1000 may be bent along the first regions (A) with the straight line shape parallel to the long side direction, the two first regions (A) may perpendicularly cross each other, and positions of the two first regions (A) prior to and/or after bending may be asymmetrical. In addition, three or more first regions (A) may be provided with the display device 1000.

The display device 1000 further includes a switching transistor, a driving transistor, and an organic light emitting diode.

The switching transistor includes a first semiconductor layer including a first source region, a first drain region, and a first channel region, a gate line including a first control electrode overlapping the first channel region, a data line including a first input electrode connected to the first source region, and a first output electrode including one side thereof connected to the first drain region and the other side thereof connected to the driving transistor.

The driving transistor includes a second semiconductor layer including a second source region, a second drain region, and a second channel region, a second control electrode that is connected to the first output electrode and overlaps the second channel region, a driving voltage line including a second input electrode connected to the second source region, and a second output electrode having one side connected to the second drain region and another side connected to the organic light emitting diode.

The organic light emitting diode includes an anode connected to the second output electrode and a cathode to which a common voltage is applied.

The switching transistor transmits a data signal applied to the first input electrode through the data line to the driving transistor through the first output electrode in response to a gate signal applied to the first control electrode through the gate line. The driving transistor supplies an output current that is varied according to a voltage applied between the second control electrode and the second output electrode to the organic light emitting diode through the second output electrode. The organic light emitting diode variously emits light according to an output current of the driving transistor, thereby displaying an image.

A gate insulating layer may be positioned at an upper or lower portion of the gate line. The gate insulating layer may prevent contamination of the gate line. An interlayer insulating layer may be positioned between signal lines such as the gate line, the data line, and the driving voltage line, or between the signal line and the semiconductor layer. The interlayer insulating layer may also prevent contamination of the gate line.

The aforementioned signal line 130 may be the gate line, and the first insulating layer 120a may be the gate insulating layer.

Alternatively, the signal line 130 according to an exemplary embodiment of the present invention may be the data line or the driving voltage line, and the first insulating layer 120a may be the interlayer insulating layer.

When a display device is bent, stress occurs at the display device. For example, tensile stress occurs at its convex outer side and compressive stress occurs at its concave inner side, while a neutral plane (at which no stress occurs) is present in an intermediate region therebetween. When tensile stress or compressive stress is applied to an inorganic layer, the inorganic layer is easily broken, thus stress is applied to a signal line which is positioned at an upper or lower portion of the inorganic layer. In addition, when the signal line leaves the neutral plane due to bending of the display device such that it moves up or down, stress is also applied to the signal line, such that the signal line may be cut off. In other words, a signal transmitted along the signal line, may not reach its destination due to the break.

According to an exemplary embodiment of the present invention, it is possible to prevent stress from being applied to a signal line due to bending. This is done, for example, by removing at least some of an inorganic layer (which may be easily broken due to the stress) in a region in which a display device is bent, forming a groove therein, and filling the groove with an organic layer that is immune to stress.

Further, in the region in which the display device is bent, at least some of the signal line may be positioned to be close to the neutral plane while bending. This is done, for example, by forming the signal lines in a plurality of layers so that the signal lines may be respectively positioned at different heights with respect to a direction perpendicular to the substrate. Accordingly, even though some layers of the signal lines are cut off due to the bending, quality deterioration of the display device may be prevented by utilizing the other layers of the signal lines.

Hereinafter, a display device according to an exemplary embodiment of the present invention will be described in detail with reference to FIG. 4. Descriptions of elements already described with reference to FIGS. 1 to 3 may be omitted.

Figure 4:
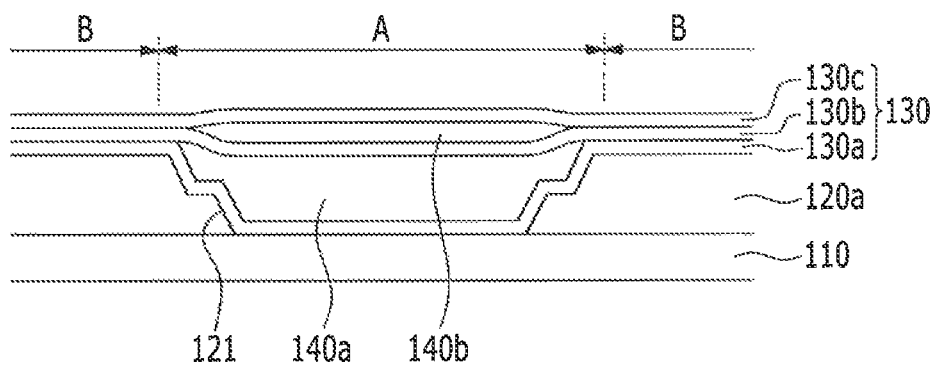
FIG. 4 to FIG. 13 illustrate cross-sectional views of a display device according to an exemplary embodiment of the present invention, respectively.

FIG. 4 illustrates a cross-sectional view of a display device according to an exemplary embodiment of the present invention.

The first inorganic layer 120a is positioned on the substrate 110. The first inorganic layer 120a includes the first groove 121 formed in the first region (A). The signal line 130 is positioned on the first inorganic layer 120a. The signal line 130 includes the first layer 130a, the second layer 130b, and a third layer 130c stacked in a direction perpendicular to the substrate 110.

The first organic layer 140a is positioned between the first layer 130a and the second layer 130b that are positioned in the first groove 121 of the first region (A). A second organic layer 140b is positioned between the second layer 130b and the third layer 130c that are positioned in the first groove 121 of the first region (A).

In the second region (B), the first layer 130a, the second layer 130b, and the third layer 130c are in direct contact with each other. In the first region (A), the first layer 130a, the second layer 130b, and the third layer 130c are respectively positioned at different heights with respect to the direction perpendicular to the substrate 110.

Hereinafter, a display device according to an exemplary embodiment of the present invention will be described in detail with reference to FIG. 5. Descriptions of elements already described with reference to FIGS. 1 to 4 may be omitted.

Figure 5:
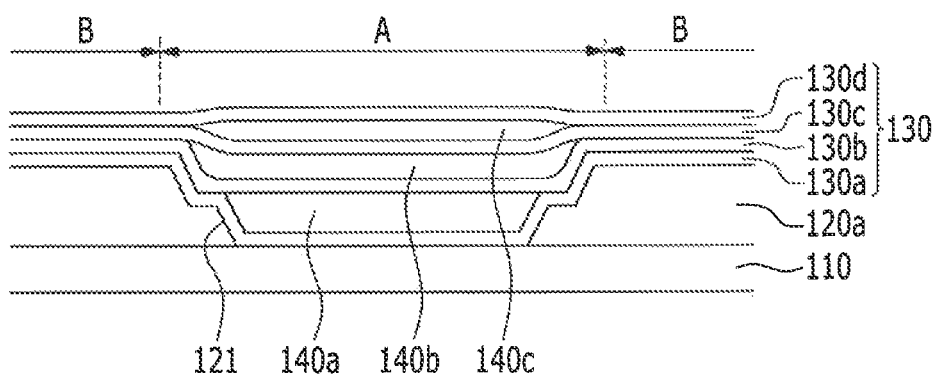

FIG. 5 illustrates a cross-sectional view of a display device according to an exemplary embodiment of the present invention.

The first inorganic layer 120a is positioned on the substrate 110, and the signal line 130 is positioned on the first inorganic layer 120a. The signal line 130 includes the first layer 130a, the second layer 130b, the third layer 130c, and a fourth layer 130d stacked in the direction perpendicular to the substrate 110.

In the first region (A), the first organic layer 140a is positioned between the first layer 130a and the second layer 130b. In the first region (A), the second organic layer 140b is positioned between the second layer 130b and the third layer 130c. In the first region (A), a third organic layer 140c is positioned between the third layer 130c and the fourth layer 130d.

In the second region (B), the first layer 130a, the second layer 130b, the third layer 130c, and the fourth layer 130d are in direct contact with each other. In the first region (A), the first layer 130a, the second layer 130b, the third layer 130c, and the fourth layer 130d are respectively positioned at different heights with respect to the direction perpendicular to the substrate 110.

Hereinafter, a display device according to an exemplary embodiment of the present invention will be described in detail with reference to FIG. 6. Descriptions of elements already described with reference to FIGS. 1 to 5 may be omitted.

Figure 6:
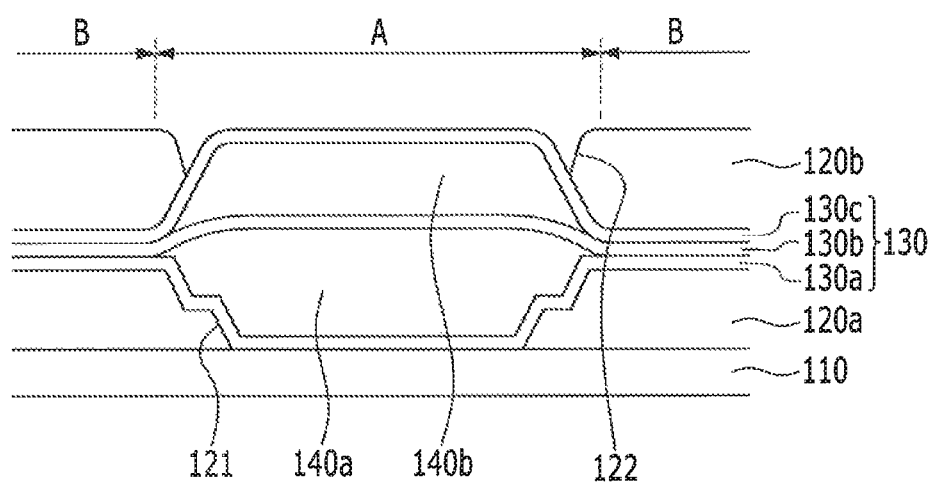

FIG. 6 illustrates a cross-sectional view of a display device according to an exemplary embodiment of the present invention.

The first inorganic layer 120a is positioned on the substrate 110, and the signal line 130 is positioned on the first inorganic layer 120a. The signal line 130 includes the first layer 130a, the second layer 130b, and the third layer 130c stacked in the direction perpendicular to the substrate 110. The first layer 130a includes a bent portion positioned in the first groove 121.

In the first region (A), the first inorganic layer 120a includes the first groove 121, and the first organic layer 140a is positioned between the first layer 130a and the second layer 130b in a region corresponding to the first groove 121. The second organic layer 140b is positioned between the second layer 130b and the third layer 130c in a region corresponding to the first groove 121 of the first region (A). In the first region (A), the first organic layer 140a and the second organic layer 140b overlap each other in the direction perpendicular to the substrate 110.

A second inorganic layer 120b is positioned on the third layer 130c. The second inorganic layer 120b includes a second groove 122 corresponding to the second organic layer 140b. Although most of the second inorganic layer 120b is removed from the first region (A), some of the second inorganic layer 120b may remain such that the second groove 122 may be formed. The third layer 130c is positioned on the second organic layer 140b and includes a bent portion in conformity with a surface of the second organic layer 140b. The bent portion of the third layer 130c is positioned in the second groove 122 of the second inorganic layer 120b and may include a convex portion with substantially the same height as that of a surface of the second inorganic layer 120b.

In the second region (B), the first layer 130a, the second layer 130b, and the third layer 130c are in direct contact with each other. In the first region (A), the first layer 130a, the second layer 130b, and the third layer 130c are respectively positioned at different heights with respect to the direction perpendicular to the substrate 110.

Hereinafter, a display device according to an exemplary embodiment of the present invention will be described in detail with reference to FIG. 7. Descriptions of elements already described with reference to FIGS. 1 to 6 may be omitted.

Figure 7:
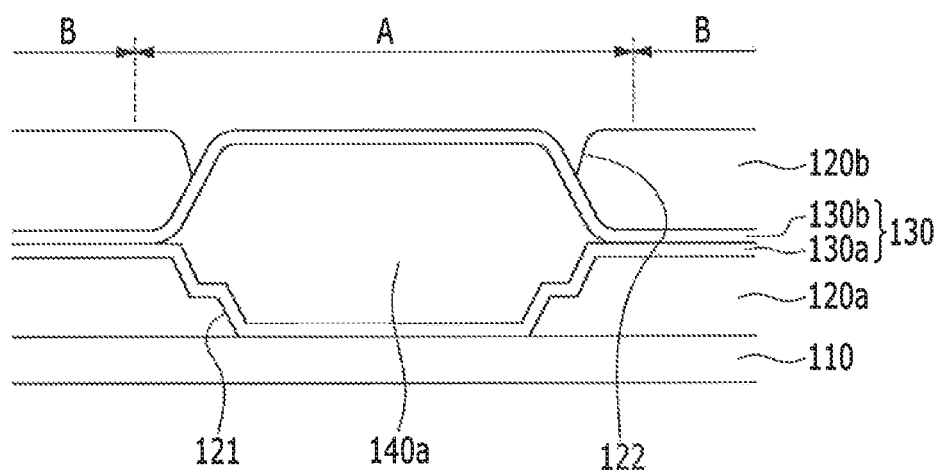

FIG. 7 illustrates a cross-sectional view of a display device according to an exemplary embodiment of the present invention.

The first inorganic layer 120a is positioned on the substrate 110, and the signal line 130 is positioned on the first inorganic layer 120a. The signal line 130 includes the first layer 130a and the second layer 130b stacked in the direction perpendicular to the substrate 110. In the first region (A), the first layer 130a is positioned in the first groove 121, and includes a bent portion corresponding to a surface of the first groove 121.

The first organic layer 140a is positioned between the first layer 130a and the second layer 130b in a region corresponding to the first groove 121 of the first region (A). The first organic layer 140a is positioned within the first groove 121.

The second inorganic layer 120b is positioned on the second layer 130b. The second inorganic layer 120b includes the second groove 122 formed in a region in which the first organic layer 140a is positioned. The second inorganic layer 120b may be mostly removed from the first region (A), and some of the second inorganic layer 120b may remain such that the second groove 122 may be formed.

The second layer 130b includes a bent portion along a surface of the first organic layer 140a, and the bent portion of the second layer 130b is positioned in the second groove 122 of the second inorganic layer 120b. The bent portion of the second layer 130b may include a convex portion with substantially the same height as that of a surface of the second inorganic layer 120b.

In the second region (B), the first layer 130a and the second layer 130b are in direct contact with each other. In the first region (A), the first layer 130a and the second layer 130b are respectively positioned at different heights with respect to the direction perpendicular to the substrate 110.

Hereinafter, a display device according to an exemplary embodiment of the present invention will be described in detail with reference to FIG. 8. Descriptions of elements already described with reference to FIGS. 1 to 7 may be omitted.

Figure 8:
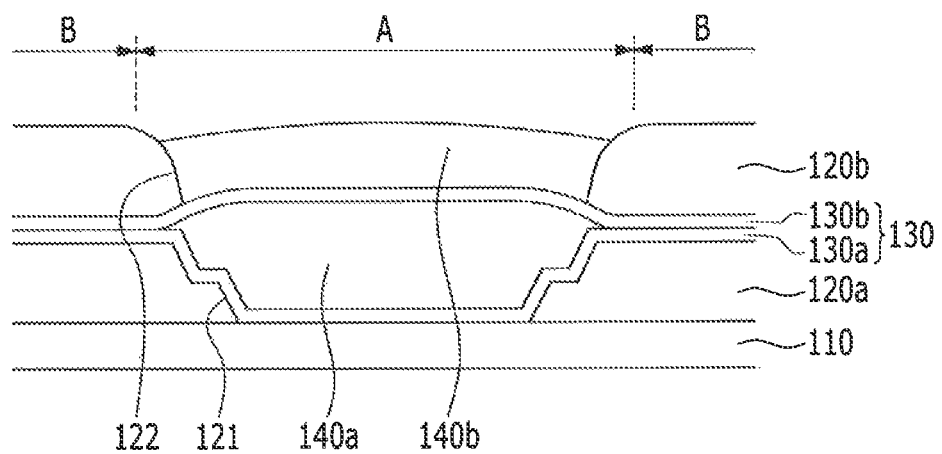

FIG. 8 illustrates a cross-sectional view of a display device according to an exemplary embodiment of the present invention.

The first inorganic layer 120a is positioned on the substrate 110, and the signal line 130 is positioned on the first inorganic layer 120a. The signal line 130 includes the first layer 130a and the second layer 130b stacked in the direction perpendicular to the substrate 110. In the first region (A), the first layer 130a is positioned in the first groove 121, and includes a bent portion along a surface of the first groove 121.

In the first region (A), the first inorganic layer 120a includes the first groove 121, and the first organic layer 140a is positioned between the first layer 130a and the second layer 130b in a region corresponding to the first groove 121.

The second inorganic layer 120b is positioned on the second layer 130b. The second inorganic layer 120b includes the second groove 122 formed in a region in which the second organic layer 140b is positioned. The second inorganic layer 120b may be mostly removed from the first region (A), but some of the second inorganic layer 120b may remain to form the second groove 122. The second organic layer 140b is positioned in the second groove 122 to cover the second layer 130b.

In the second region (B), the first layer 130a and the second layer 130b are in direct contact with each other. In first region (A), the first layer 130a and the second layer 130b are respectively positioned at different heights with respect to the direction perpendicular to the substrate 110.

Hereinafter, a display device according to an exemplary embodiment of the present invention will be described in detail with reference to FIG. 9. Descriptions of elements already described with reference to FIGS. 1 to 8 may be omitted.

Figure 9:
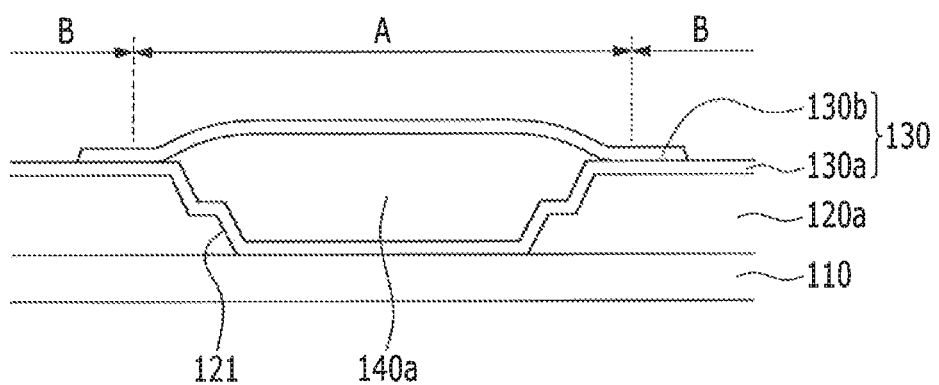

FIG. 9 illustrates a cross-sectional view of a display device according to an exemplary embodiment of the present invention.

The first inorganic layer 120a is positioned on the substrate 110. In the first region (A), the first inorganic layer 120a includes the first groove 121. The signal line 130 is positioned on the first inorganic layer 120a. The signal line 130 includes the first layer 130a and the second layer 130b stacked in the direction perpendicular to the substrate 110. In the first region (A), the first layer 130a is positioned in the first groove 121, and includes a bent portion on a surface of the first groove 121.

The first organic layer 140a is positioned between the first layer 130a and the second layer 130b in a region corresponding to the first groove 121 of the first inorganic layer 120a.

In the second region (B), the first layer 130a and the second layer 130b are in direct contact with each other. In the second region (B), a portion of the signal line 130 may include only the first layer 130a and not the second layer 130b. For example, that portion of the signal line 130 may include the first layer 130a and not the second layer 130b. In the first region (A), the first layer 130a and the second layer 130b are respectively positioned at different heights with respect to the direction perpendicular to the substrate 110.

Alternatively, in the second region (B), a portion of the signal line 130 may include only the second layer 130b and not the first layer 130a. For example, that portion of the signal line 130 may include the second layer 130b and not the first layer 130a. In the second region (B) in which the display device is not bent, when the signal line 130 consists of one of the first layer 130a and the second layer 130b, it is possible to reduce a thickness of the display device. Although the aforementioned discussion was made in reference to a signal line with two layers, when the signal line consists of three or more layers, the second region (B) may include only one of the three or more layers.

Hereinafter, a display device according to an exemplary embodiment of the present invention will be described in detail with reference to FIG. 10. Descriptions of elements already described with reference to FIGS. 1 to 9 may be omitted.

Figure 10:
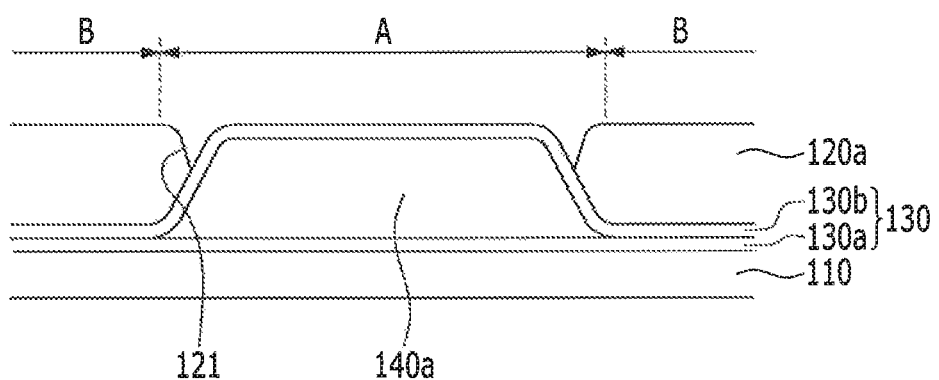

FIG. 10 illustrates a cross-sectional view of a display device according to an exemplary embodiment of the present invention.

The signal line 130 is positioned on the substrate 110. The signal line 130 includes the first layer 130a and the second layer 130b stacked in the direction perpendicular to the substrate 110.

In the first region (A), the first organic layer 140a is positioned between the first layer 130a and the second layer 130b.

The first inorganic layer 120a is positioned on the second layer 130b. The first inorganic layer 120a includes the first groove 121 formed in a region corresponding to the first organic layer 140a. The second layer 130b includes a bent portion along a surface of the first organic layer 140a. The bent portion of the second layer 130b is positioned in the first groove 121 of the first inorganic layer 120a and may include a convex portion with substantially the same height as that of a surface of the second inorganic layer 120a.

Hereinafter, a display device according to an exemplary embodiment of the present invention will be described in detail with reference to FIG. 11. Descriptions of elements already described with reference to FIGS. 1 to 10 may be omitted.

Figure 11:
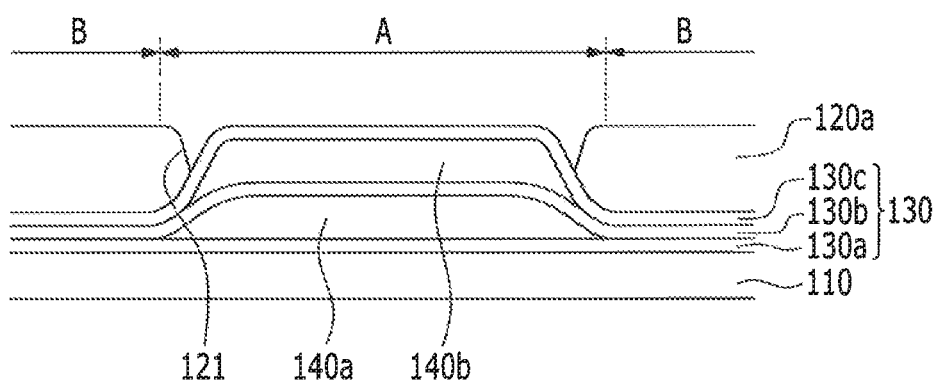

FIG. 11 illustrates a cross-sectional view of a display device according to an exemplary embodiment of the present invention.

The signal line 130 is positioned on the substrate 110. The signal line 130 includes the first layer 130a, the second layer 130b, and the third layer 130c stacked in the direction perpendicular to the substrate 110.

In the first region (A), the first organic layer 140a is positioned between the first layer 130a and the second layer 130b. In the first region (A), the second organic layer 140b is positioned between the second layer 130b and the third layer 130c.

The first inorganic layer 120a is positioned on the third layer 130c. The first inorganic layer 120a includes the first groove 121 formed in a region in which the first organic layer 140a and the second organic layer 140b are positioned. The second layer 130b includes a bent portion conformally formed on a surface of the first organic layer 140a, and the third layer 130c includes a bent portion conformally formed on a surface of the second organic layer 140b. The bent portion of the second layer 130b and the bent portion of the third layer 130c are positioned in the first groove 121 of the first inorganic layer 120a. The bent portion of the third layer 130c may include a convex portion with substantially the same height as that of a surface of the first inorganic layer 120a.

Hereinafter, a display device according to an exemplary embodiment of the present invention will be described in detail with reference to FIG. 12. Descriptions of elements already described with reference to FIGS. 1 to 11 may be omitted.

Figure 12:
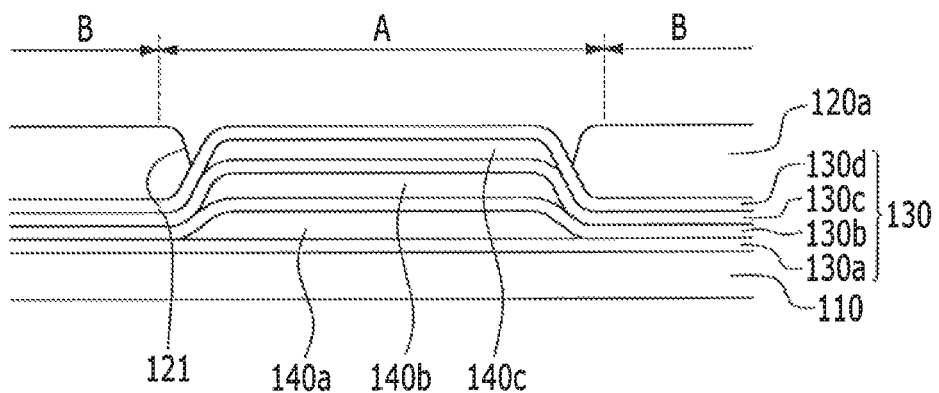

FIG. 12 illustrates a cross-sectional view of a display device according to an exemplary embodiment of the present invention.

The signal line 130 is positioned on the substrate 110. The signal line 130 includes the first layer 130a, the second layer 130b, the third layer 130c, and the fourth layer 130d stacked in the direction perpendicular to the substrate 110. In the first region (A), the first organic layer 140a is positioned between the first layer 130a and the second layer 130b. The second layer 130b includes a bent portion corresponding to a surface of the first organic layer 140a. In the first region (A), the second organic layer 140b is positioned between the second layer 130b and the third layer 130c. The third layer 130c includes a bent portion corresponding to a surface of the second organic layer 140b. In the first region (A), the third organic layer 140c is positioned between the third layer 130c and the fourth layer 130d. The fourth layer 130d includes a bent portion corresponding to a surface of the third organic layer 140c.

The first inorganic layer 120a is positioned on the fourth layer 130d. The first inorganic layer 120a includes the first groove 121 formed in a region in which the first organic layer 140a, the second organic layer 140b, and the third organic layer 140c are positioned. The bent portion of the fourth layer 130d, the bent portion of the third layer 130c, and the bent portion of the second layer 130b are positioned in the first groove 121 of the first inorganic layer 120a. The bent portion of the fourth layer 130d may include a convex portion with substantially the same height as that of a surface of the first inorganic layer 120a.

Hereinafter, a display device according to an exemplary embodiment of the present invention will be described in detail with reference to FIG. 13. Descriptions of elements already described with reference to FIGS. 1 to 12 may be omitted.

Figure 13:
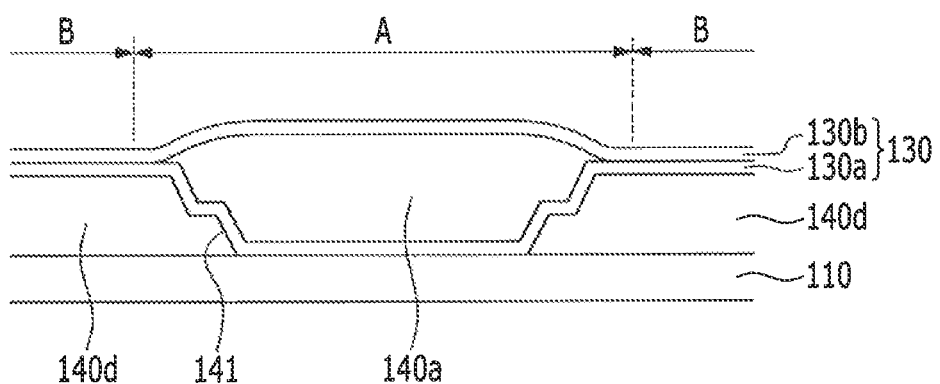

FIG. 13 illustrates a cross-sectional view of a display device according to an exemplary embodiment of the present invention.

A first insulating layer is positioned on the substrate 110. For example, the first insulating layer may be a fourth organic layer 140d. The fourth organic layer 140d includes a third groove 141 formed in a region in which the first organic layer 140a is positioned. The signal line 130 is positioned on the fourth organic layer 140d. The signal line 130 includes the first layer 130a and the second layer 130b stacked in the direction perpendicular to the substrate 110.

In the first region (A), the first organic layer 140a is positioned between the first layer 130a and the second layer 130b. In the first region (A), the first layer 130a is positioned in the third groove 141, and may include a bent portion along a surface of the third groove 141.

In the second region (B), the first layer 130a and the second layer 130b are in direct contact with each other. In the first region (A), the first layer 130a and the second layer 130b are respectively positioned at different heights with respect to the direction perpendicular to the substrate 110.

According to an exemplary embodiment of the present invention, by increasing resistance against deformation, performance of the display device may be maintained without being deformed or broken by a bending action, for example. In other words, a display device according to an exemplary embodiment of the present invention has characteristics that may not deteriorate by a folding action.

Although the present invention has been described with reference to the exemplary embodiments, the present invention is not limited thereto, and may be variously modified. For example, although the present invention has been described while referring to the organic light emitting device, the present invention may be applied to the signal lines of a variety of display devices including a liquid crystal display, a plasma display device, and the like.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display device, comprising:
   a substrate including a first region and a second region;
   a signal line on the substrate and including a first layer and a second layer that overlap each other;
   a portion of a first insulating layer between the substrate and the signal line;
   a first organic layer between the substrate and the second layer in the first region; and
   a second organic layer on the second layer in the first region,
   wherein the first layer and the second layer are in direct contact with each other in the second region, and
   wherein the signal line includes a third layer on the second organic layer.

2. The display device of claim 1, wherein the first insulating layer includes a first groove in an area in which the first organic layer is, the first insulating layer is a first inorganic layer including an inorganic material, and the first layer includes a bent portion in the first groove.

3. The display device of claim 2, wherein the first region is bendable.

4. The display device of claim 3, further comprising:
   a plurality of the first regions.

5. The display device of claim 3, wherein the signal line includes only one of the first layer and the second layer in a portion of the second region.

6. The display device of claim 1, wherein the signal line includes a fourth layer, and a third organic layer is between the third layer and the fourth layer.

7. The display device of claim 1, further comprising:
   a second inorganic layer overlapping the first inorganic layer with the signal line therebetween,
   wherein the second inorganic layer includes a second groove in an area in which the second organic layer is.

8. The display device of claim 1, wherein the first insulating layer includes an organic material.

9. The display device of claim 1, wherein the first layer and the second layer overlap each other in a direction substantially perpendicular to the substrate.

10. The display device of claim 1, wherein the first layer is between the substrate and the first organic layer.

11. The display device of claim 1, wherein the first organic layer and the second organic layer comprise polyimide.

12. A display device, comprising:
    a substrate including a first region and a second region;
    a signal line on the substrate and including a first layer and a second layer that overlap each other;
    a portion of a first inorganic layer between the substrate and the signal line;
    a second inorganic layer overlapping the first inorganic layer with the signal line therebetween; and
    a first organic layer is between the first layer and the second layer in the first region,
    wherein the first layer and the second layer are in direct contact with each other in the second region,
    the first layer is in contact with the substrate in the first region,
    the first inorganic layer includes a first groove in an area in which the first organic layer is, and
    the second inorganic layer includes a second groove in the area in which the first organic layer is, and the first organic layer is in the second groove.

13. A display device, comprising:
    a substrate including a first region and a second region;
    a signal line on the substrate and including a first layer and a second layer that overlap each other;
    a portion of a first inorganic layer between the substrate and the signal line;
    a second inorganic layer overlapping the first inorganic layer with the signal line therebetween; and
    a first organic layer is between the first layer and the second layer in the first region,
    wherein the first layer and the second layer are in direct contact with each other in the second region,
    the first layer is in contact with the substrate in the first region,
    the first inorganic layer includes a first groove in an area in which the first organic layer is, and
    the second inorganic layer includes a second groove in the area in which the first organic layer is, and the second organic layer is in the second groove.

14. A display device, comprising:
    a substrate including a first region and a second region;
    a signal line on the substrate and including a first layer and a second layer that overlap each other;
    a first inorganic layer between the substrate and the signal line; and
    a first organic layer is between the first layer and the second layer in the first region,
    wherein the first layer and the second layer are in direct contact with each other in the second region,
    the first layer is in contact with the substrate in the first region, and
    the first inorganic layer includes a first groove in an area in which the first organic layer is and the second layer includes a bent portion in the first groove.

15. The display device of claim 14, wherein the first region is bendable.

16. The display device of claim 15, wherein the signal line includes a third layer, and a second organic layer is positioned between the second layer and the third layer.

17. The display device of claim 16, wherein the signal line includes a fourth layer, and a third organic layer is between the third layer and the fourth layer.

18. The display device of claim 14, wherein the first layer and the second layer overlap each other in a direction substantially perpendicular to the substrate.

* * * * *